United States Patent [19]

Rich, III

[11] Patent Number: 4,967,201

[45] Date of Patent: Oct. 30, 1990

[54] MULTI-LAYER SINGLE SUBSTRATE MICROWAVE TRANSMIT/RECEIVE MODULE

[75] Inventor: Edward L. Rich, III, Arnold, Md.

[73] Assignee: Westinghouse Electric Corp., Pittsburgh, Pa.

[21] Appl. No.: 111,328

[22] Filed: Oct. 22, 1987

[51] Int. Cl.$^5$ .............................................. H05K 7/20
[52] U.S. Cl. ........................................ 342/175; 357/81
[58] Field of Search ........................... 342/175; 357/81; 361/386, 401, 414

[56] References Cited

U.S. PATENT DOCUMENTS

| | | | |
|---|---|---|---|
| 3,899,720 | 8/1975 | Peterson | 357/74 X |
| 4,099,318 | 7/1978 | Cooper et al. | 357/81 X |
| 4,251,817 | 2/1981 | Kimura et al. | |
| 4,259,743 | 3/1981 | Kaneko et al. | |
| 4,405,925 | 9/1983 | Lindner et al. | |
| 4,490,721 | 12/1984 | Stockton et al. | 342/368 |
| 4,578,279 | 3/1986 | Zingher | |
| 4,636,753 | 1/1987 | Geller et al. | |
| 4,661,836 | 4/1987 | Mun | 357/81 |
| 4,729,061 | 3/1988 | Brown | 357/81 X |
| 4,739,334 | 4/1988 | Soref | 342/368 |

OTHER PUBLICATIONS

Ogawa et al., A 26-GHz High-Performance MIC Transmitter/Receiver for Digital Radio Subscriber Systems, IEEE Transactions on Microwave Theory and Techniques, vol. MIT-32, No. 12, Dec. 1984.

Hori et al., GaAs Monolithic MIS's for Direct Broadcast Satellite Receivers, IEEE Transactions on Microsave Theory and Techniques, vol. MIT-31, No. 12, 12/83.

Mahle et al., MMIC's in Communications, IEEE Communications Magazine, vol. 23, No. 9, Sep. 1985.

Rich et al., Thermal Management Considerations for Low-Temperature, Co-Fireable Ceramic System, ISHM '87 Proceedings.

Primary Examiner—Thomas H. Tarcza
Assistant Examiner—Mark Hellner
Attorney, Agent, or Firm—W. G. Sutcliff

[57] ABSTRACT

A microwave transmit/receive module comprises a single multi-layer substrate having at least two opposed mounting surfaces. The substrate including a plurality of integrated dielectric layers, electrical conductors and thermal conductors selectively interconnected between the layers of the substrate. A microwave signal processing means is mounted on at least one of the mounting surfaces of the substrate for processing microwave radar signals. A control signal processing means is mounted on at least one of the mounting surfaces of the substrate for providing control signals for the microwave signal processing means via selected electrical conductors. A power conditioning means is mounted on at least one of the mounting surfaces of the substrate for providing power to the microwave signal processing means and the control signal processing means via selected electrical conductors. A heat sink interface means coupled to the thermal conductors is mounted on at least one of the mounting surfaces of the substrate in thermal proximity selected portions of the microwave signal processing means, the power conditioning means and the control signal processing means for conducting thermal energy away therefrom via selected thermal conductors. An optical interface interface as well as an integrated coaxial cable carrying power, control and microwave signals for the module.

24 Claims, 8 Drawing Sheets

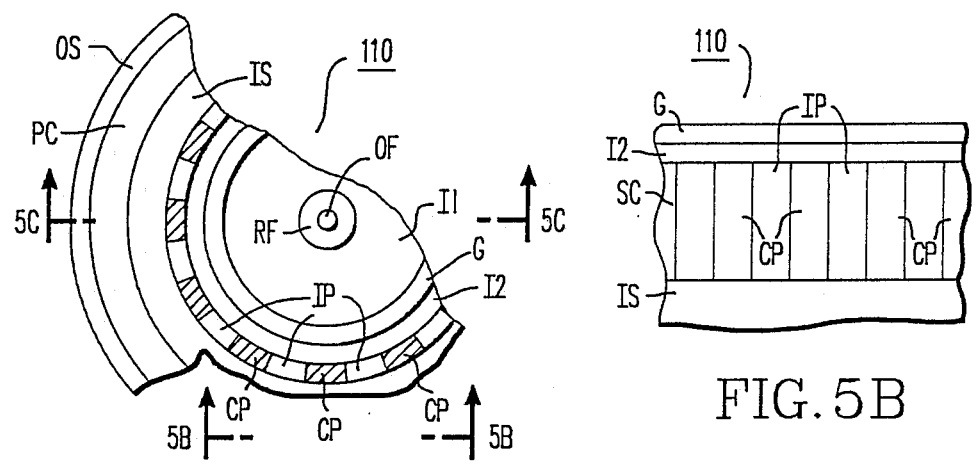
FIG.5A
FIG.5B
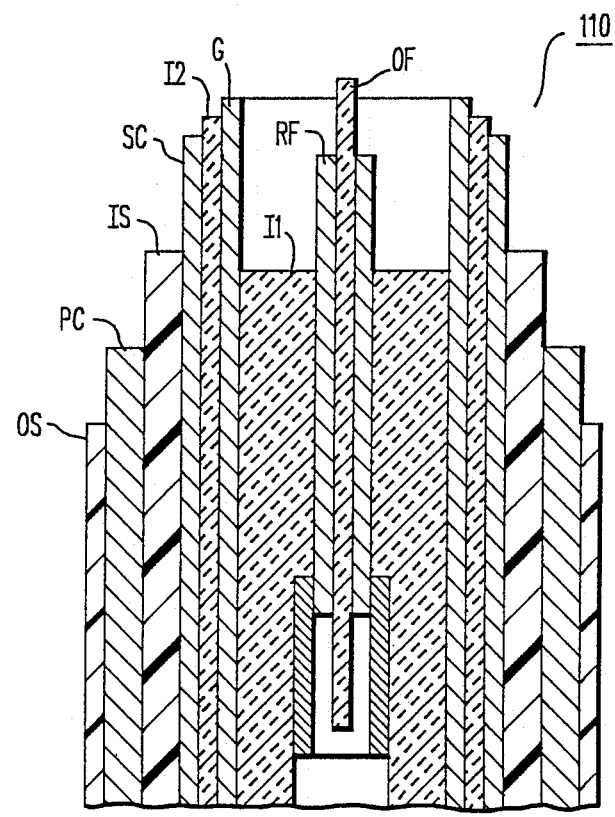
FIG.5C

MULTI-LAYER SINGLE SUBSTRATE MICROWAVE TRANSMIT/RECEIVE MODULE

BACKGROUND OF THE INVENTION

Phased array radars require many individually controllable transmit/receive modules (hereinafter T/R modules) arranged in an array of N×M modules. Each T/R module includes microwave signal processing means comprising a number of microwave or RF frequency processing components for processing radar signals; control signal processing means comprising a number of signal processing components selectively interconnected with the microwave signal processing components for providing control signals thereto; and power conditioning means comprising a number of power conditioning components selectively interconnected with the microwave signal processing components and the control signal processing components for providing power thereto. Also, because the phased array radars operate at relatively high power levels, there is usually provided means for cooling the various components, especially the microwave signal processing components and the power conditioning components.

Phased array radars may require as many as 2000 T/R modules, each measuring as much as 6 inches on a side and being several inches thick and dissipating many watts of power. The cost of each module may be many thousands of dollars. The relatively large size of each module adds considerably to the cost because there are many lead connections which must be individually made and each connection (especially at microwave frequencies) must be optimally designed to reduce noise loses and side lobes.

In so-called monolithic microwave integrated circuits (MMIC's) the fabrication of microwave components, whether active or passive, and their interconnections onto a single substrate has been proposed by Stockton et al. in U.S. Pat. No. 4,490,721. However, a MMIC as shown in Stockton et al. does not integrate on a substrate various functional technologies including microwave, power conditioning, control, memory and heat management. Furthermore, Stockton et al. relies on thin film techniques and IC fabrication techniques which normally have very low yields, especially when the various elements are distributed over a relatively large substrate area. Thus, although miniaturization is desirable because performance and cost are usually dramatically improved, the arrangement disclosed by Stockton et al. has some serious shortcomings.

A multi-layer package for Large Scale Integration (LSI) chips and a method of testing and inspecting such a package has been described by Zingher in U.S. Pat. No. 4,578,279. However, the package is not useful for microwave applications because it has no provision for mounting and cooling microwave and power circuits.

SUMMARY OF THE INVENTION

There has been provided a radar trasmit/receive module comprising a single multi-layer substrate having at least two opposed mounting surfaces. The substrate includes a plurality of integrated dielectric layers, electrical conductors and thermal conductors selectively interconnected between the layers of the substrate. A microwave signal processing means is mounted on at least one of the mounting surfaces of the substrate for processing microwave radar signals. A control signal processing means is mounted on at least one of the mounting surfaces of the substrate for providing control signals for the microwave signal processing means via selected electrical conductors. A power conditioning means is mounted on at least one of the mounting surfaces of the substrate for providing power to the microwave signal processing means and the control signal processing means via selected electrical conductors. A heat sink interface means coupled to the thermal conductors is mounted on at least one of the mounting surfaces of the substrate in thermal proximity to selected portions of the microwave signal processing means, the power conditioning means and the control signal processing means for conducting thermal energy away therefrom via selected thermal conductors.

BRIEF DESCRIPTION OF THE DRAWINGS

FIG. 5A is a partially fragmented end view of a multi-shell optical/electrical coaxial cable adapted for use in the present invention.

FIG. 5B is a side view of the cable taken along line 5B—5B of FIG. 5A.

FIG. 5C is a sectional view of the cable taken along line 5C—5C of FIG. 5A.

DESCRIPTION OF THE INVENTION

Figure 1:
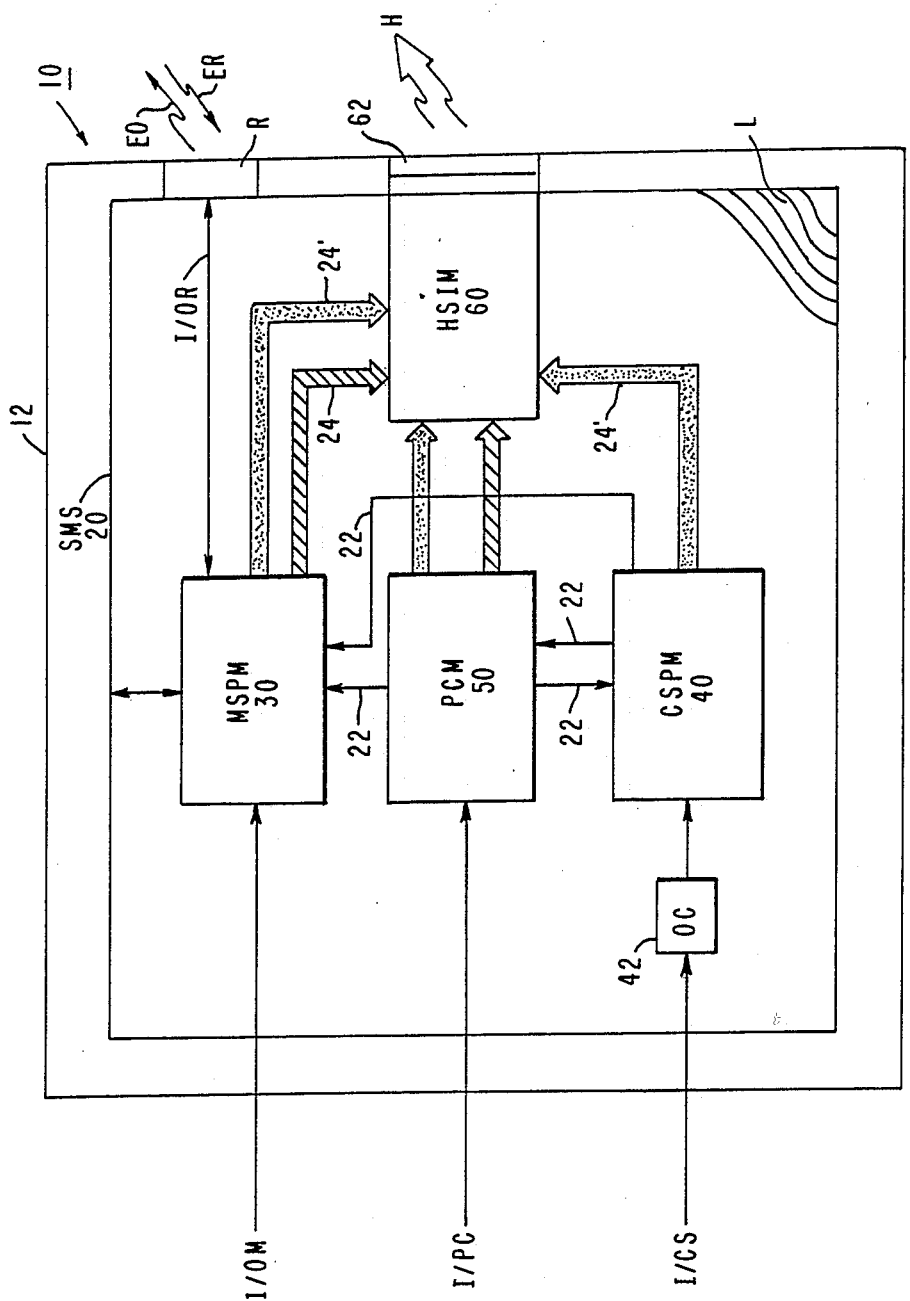
FIG. 1 is a schematic block diagram of an illustrative embodiment of the T/R module of the present invention.

FIG. 1 illustrates in schematic block form a T/R module 10 in accordance with the present invention. The module 10 includes a housing 12 and a radiator R mounted therein for radiating and receiving microwave energy shown as arrows EO and ER respectively. The module 10 further includes a single multi-layer substrate 20 (SMS 20), also shown in FIG. 2, which includes a plurality of integrated dielectric layers L, electrical conductors 22, and thermal conductors 24 selectively interconnected between the layers L. The substrate 20 has at least two opposed mounting surfaces S1 and S2 (FIG. 2).

A microwave signal processing means 30 (sometimes hereinafter referred to as MSPM 30) is mounted on at least one of the mounting surfaces S1 for processing microwave radar signals. A control signal processing means 40 (sometimes hereinafter referred to as CSPM 40) is mounted on at least one of the mounting surfaces S2 of the substrate 20 for providing control signals to the microwave signal processing means 30 via selected ones of the electrical conductors 22. A power conditioning means 50 (sometimes hereinafter referred to as PCM 50) is mounted on at least one of the mounting surfaces S1 of the substrate for providing power to the microwave signal processing means 30 and the control signal processing means 40 via selected ones of the electrical conductors 22. A heat sink interface means 60 (sometimes hereinafter referred to as HSIM 60), coupled to the thermal conductors 24, is mounted on at least one of the mounting surfaces S2 in thermal proximity to selected portions of the microwave signal processing means 30, the power conditioning means 50 and the control signal processing means for conducting thermal energy H away therefrom. Thermal energy may also be carried by selected portions of the electrical conductors 22 or by bulk energy dissipation within the substrate 20 to the heat sink interface means 60 as illustrated by the dotted arrows 24'. The heat sink interface means 60 is in thermal contact with the housing 12 at 62 for coupling or directing thermal energy or waste heat exterior of the housing 12 as shown schematically by the enlarged wavy arrow H.

Figure 2:
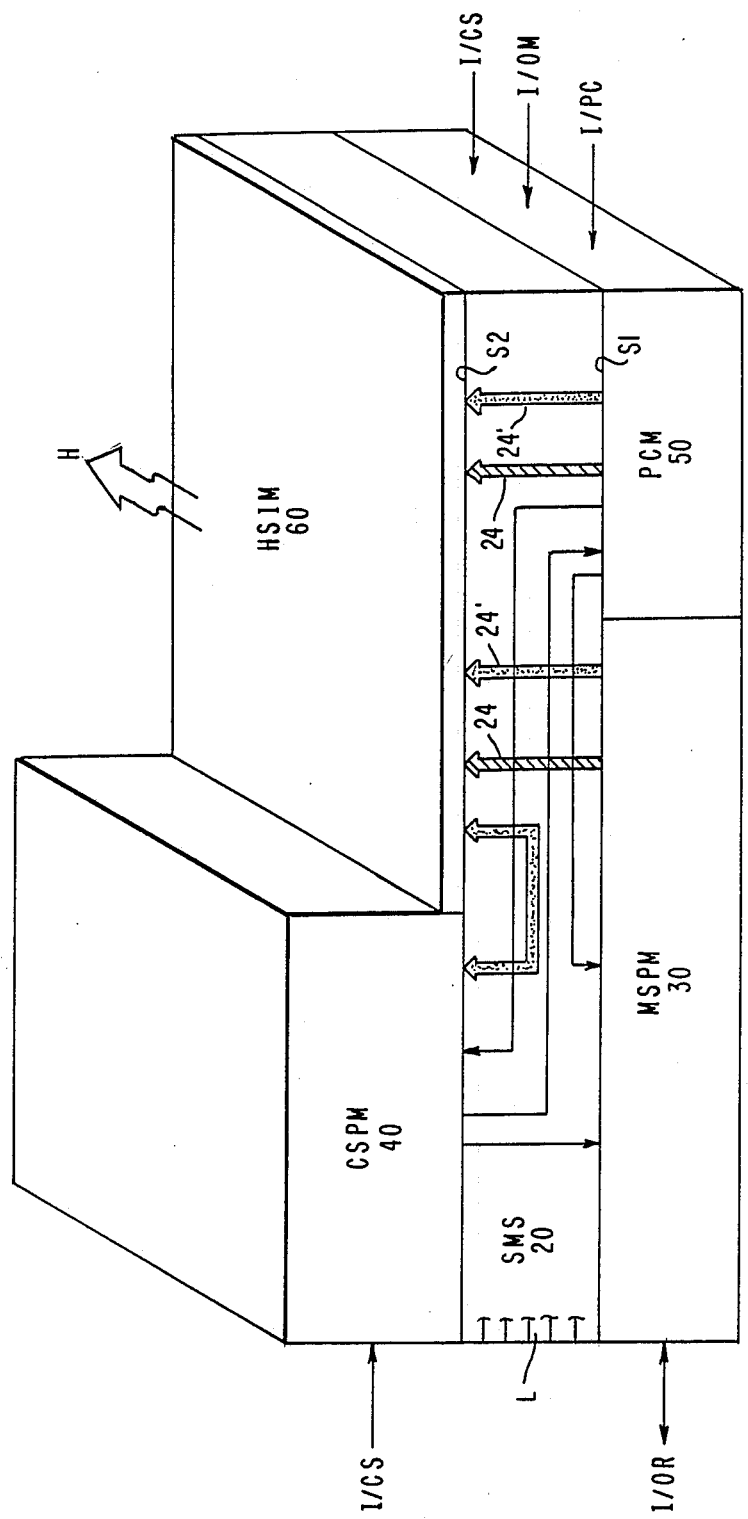
FIG. 2 is a schematic illustration, in perspective, showing the physical arrangement of the elements illustrated in FIG. 1.

Also illustrated in FIGS. 1 and 2 are a variety of inputs and outputs as follows. Microwave input/output I/OM is coupled to the microwave signal processing means 30 for processing inputs and outputs thereto. Radiator input/output I/OR couples the microwave signal processing means 30 with the radiator R for processing radar transmit pulses EO and radar receive pulses ER. Power input I/PC is coupled to the power conditioning means for providing power to the module 10. Control signal input I/CS is coupled to the control signal processing means 40 for providing input control signals for the T/R module 10.

Figure 6:
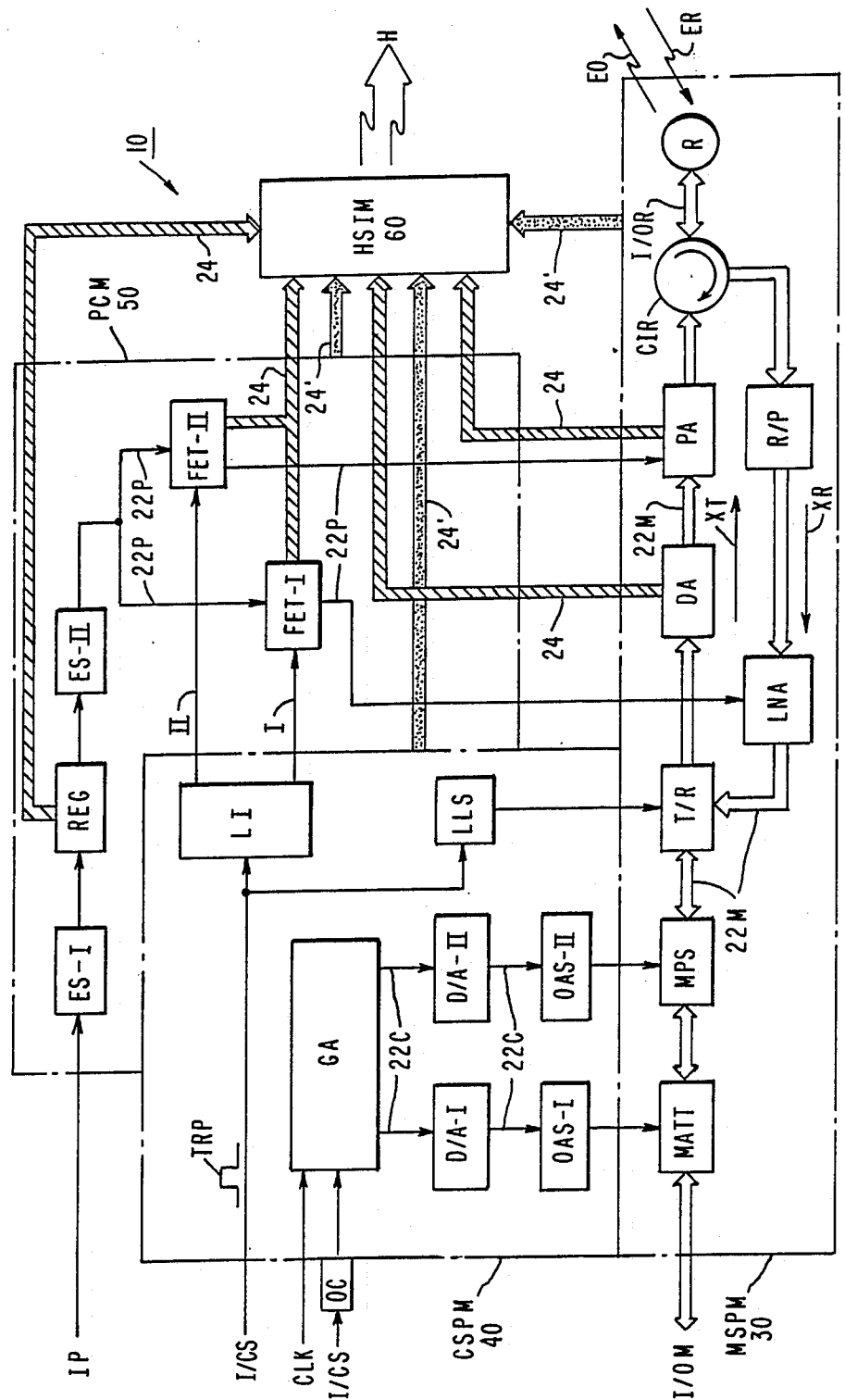
FIG. 6 is a schematic illustration of a T/R module similar to that shown in FIG. 1 but illustrating the individual components of the module in block form.

FIG. 6 is a schematic illustration of an embodiment of a T/R module 10 similar to that of FIG. 1, but shown in more detail. For purposes of illustration, electrical control signals are carried on electrical conductors 22C. Power is carried on electrical conductors 22P and microwave energy is carried on electrical conductors (e.g. striplines) 22M. Thermal energy is carried on thermal conductors 24. Bulk thermal energy is conducted through the bulk of the substrate 20 and electrical conductors and is symbolically shown by the thermal conductors 24'.

The circuit illustrated in FIG. 6 includes microwave signal processing means (MSPC) 30, control signal processing means (CSPM) 40, power conditioning means (PCM) 50 and heat sink interface means (HSIM) 60. The MSPM 30 processes microwave signals at microwave input/output I/OM via stripline electrical conductors 22M. The input I/OM is selectively attenuated by variable microwave attenuator MATT and selectively phase shifted by microwave phase shifter MPS which is coupled thereto. Transmit receive switch T/R receives phase shifted and attenuated microwave input signals and couples the signals to circulator CIR via drive amplifier DA and power amplifier PA. Radiator input/output I/OR of the circulator CIR is coupled to the radiator R which emits directed microwave or RF energy EO (shown as an arrow directed away from radiator R). Reflected energy signals ER (shown as an arrow directed toward radiator R) are reflected from a target (not shown), are received by the radiator R and are introduced to the receiver protector R/P via radiator input/output I/OR and circulator CIR. Circulator CIR is a device known in the art which allows transmitted signals to move unidirectionally therethrough and allows received signals to move unidirectionally in another direction thereby providing input and output processing over different channels, for example transmit channel XT and receive XR channel.

The receiver protector R/P blocks excessive reflected signal such as noise or countermeasure energy and produces an output to a two-stage low noise amplifier LNA, the output of which is coupled to the transmit receive switch T/R and to the microwave input/output I/OM via microwave phase shifter MPS and attenuator MATT. Microwave signals processed by the microwave signal processing means 30 are carried between the various described elements by electrical conductors 22M which are illustrated as striplines. Where possible, striplines are avoided and other less complex connections are made.

When the T/R switch is switched for actuating the transmission channel XT, the radiator R transmits energy EO. When the T/R switch is changed over, the receive channel XR of the MSPM 30 processes received energy ER from a target.

Control for the MSPM 30 is provided by control signal processing means 40 (CSPM 40). Control signal input I/CS drives gate array GA through an optical coupler OC. Gate array GA provides digital outputs to digital to analog converters D/A-I and D/A-II. The analog output of D/A-I is coupled to operational amplifier level shifter OAS-I which provides control input for the microwave attenuator and MATT. The output of digital to analog converter D/A-II is coupled to microwave phase shifter MPS through operational amplifier level shifter OAS-II. Gate array GA receives a clock signal over input CLK.

A transmit receive pulse TRP from another input control channel I/CS is coupled to transmit receive switch T/R via logic level shifter LLS to thereby control the state of the MSPM 30. TRP pulse also drives logic inverter LI which has oppositely phased outputs I and II.

Power conditioning means 50 (PCM 50) includes a regulator REG which receives input power over power input I/P and first energy storage device ES-I, and produces regulated power outputs to a pair of HEX FET switches FET-I and FET-II through second energy storage device ES-II. FET-I gates power to low noise amplifier LNA and FET-II gates power to power amplifier PA in response to the respective oppositely phased outputs I and II of the logic inverter LI. Thus, when FET-I is on, FET-II is off so that the microwave signal processing means 30 operates as a dual channel device. First energy storage device ES-I is responsive to handle pulsed energy in the hundreds of microseconds range. Second energy storage device ES-II is responsive to handle pulsed energy in the sub-micro second range.

The regulator REG, FET-I and FET-II, power amplifier PA and drive amplifier DA are connected to heat sink interface means 60 (HSIM-60) via thermal conductors 24. Bulk thermal conductors 24' carry heat via bulk heat transfer through the substrate 20 to conduct heat away from other elements of the system.

In the present invention the single multi-layer substrate is uniquely adapted to support, in a remarkably compact structure, all of the elements of the T/R module 10 in a rugged and reliable package less than one cubic inch in size. The T/R module 10 is arranged so that interconnects using striplines are minimized and are often eliminated, low tolerance passive elements are utilized wherever possible, and laser trimming, often used with devices of the type described herein, is minimized.

Figure 3:
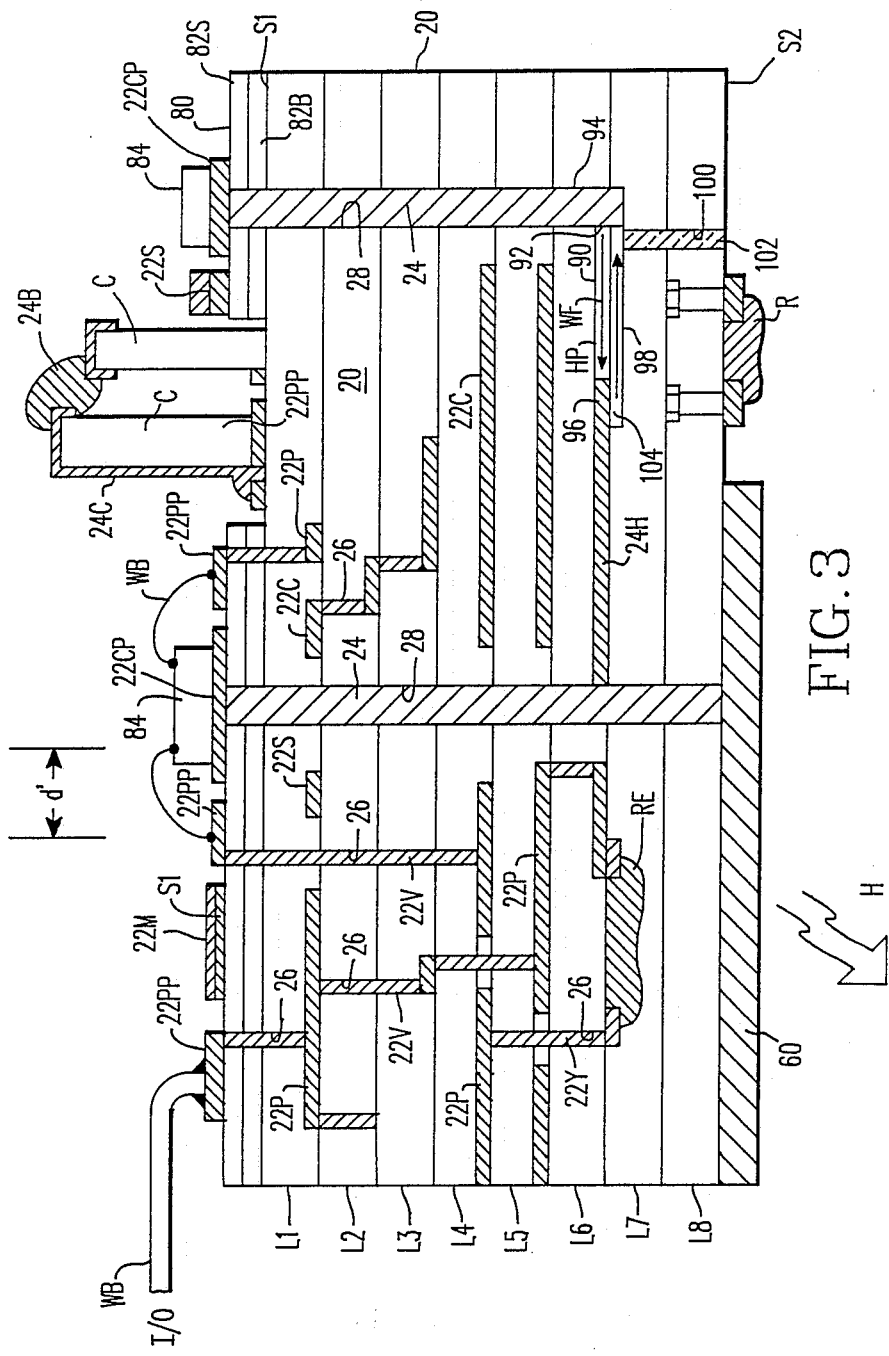
FIG. 3 is a side sectional elevation of a multi-layer substrate of the present invention showing a variety of exemplary components integrated into the substrate or mounted thereon.

In one embodiment, shown schematically in side sectional elevation in FIG. 3, the single multi-layer substrate 20 is formed of multiple layers L1-L8 of unfired green ceramic such as a material sold under the trademark GREENTAPE by E. I. DuPont. The layers L1-L8 are punched with electrical vias 26 and thermal vias 28. Thereafter, various patterns of electrical conductors 22 are deposited on the layers L1-L8 and in the vias 26. Electrical conductors 22, referred to above with respect to FIG. 1, are generally of two types, namely, power conductors 22P and bias or control signal conductors 22C (FIG. 3). Electrical vias 26 support electrical conductors which may carry signal and power and are referred to generally as 22V. Thermal vias 28 are filled with thermal conductors 24. Collated layers L1-L8 are registerably laminated, trimmed, pressed and dried at low temperature and are thereafter fired at a relatively high temperature to form an integrated glass ceramic structure having electrical conductors 22 and thermal conductors 24 integrally formed therein.

A microwave chip carrier 80 (FIG. 3), formed in one embodiment of a thermally conductive base sheet 82B such as a tungsten copper matrix sold under the trade name Thermkon by Contacts Metals Welding Inc., is bonded to a gallium arsenide GaAs substrate 82S. As set forth in the example which follows, the base sheet 82B has good thermal conductivity and has a coefficient of expansion which is close to the GaAs substrate 82S. The GaAs substrate 82S has a copper layer (not shown) bonded thereto which is later etched by photolithographic techniques to form microstrip circuitry such as microwave striplines 22M, chip pads 22CP and power pads 22PP. Thick film capacitors C and resistors R are usually directly formed and fired onto either or both sides S1 or S2 of the multi-layer substrate 22 or onto the chip carrier 80 if desired. The chip carrier 80 is thereafter bonded to the substrate 20 on side S1 is illustrated.

In accordance with the invention integrated, circuits or chips 84 and other devices which generate heat and which are also sensitive to heat (FIG. 6) are mounted on substrate 20 directly or on the chip carrier 80 at selected locations. Such locations correspond to the locations above or thermally proximate to the thermal conductors 24 so that when the individual components or the chip carrier 80 are bonded to the substrate 20 heat generating chips 84 and other elements are in thermal proximity (e.g. axially aligned) with selectively placed thermal conductors 24. Heat generated by the chips 84 is conducted through the substrate 20 from the side S1, as shown, to the side of S2. Heat sink interface means 60 (HSIM 60), in the form of a metal film is deposited on a part of side S2 of the substrate 20 in thermal contact with the thermal conductors 24 to provide a large surface area for conveying heat H away from heat sensitive chips 84. A heat exchanger (not shown) may be placed in contact with HSIM 60 to remove heat from the module 10.

Inputs and outputs of each of the chips 84 are wire bonded to an electrically conducting power pads 22PP by wire bonds WB. A wire bond WB also may be provided generally for input/output connections I/O.

In the embodiment of the invention illustrated in FIG. 3, a totally encapsulated thick film resistor RE is illustrated. In the embodiment shown, the thick film encapsulated resistor RE is formed during the part of the process in which each of the layers L1-L8 are patterned. Encapsulated thick film capacitors (not shown) may be similarly formed.

It is also possible to provide lateral heat transfer for the single multi-layer substrate 20 of the present invention by means of an integrated heat pipe HP, shown located between layers L6 and L7 in FIG. 3. The heat pipe HP includes an elongated chamber 90 formed partly in each of the layers L6 and L7. A lower end 94 of thermal conductor 24 is in thermal proximity with an evaporator end 92 of the heat pipe HP. A working fluid (shown by the arrows WF) within the chamber 90 is evaporated by heat conducted to the lower end 94 of the thermal conductor 24. The evaporated working fluid WF moves to the left towards the condenser end 96 of the heat pipe HP. The working fluid WF condenses on the end 104 of horizontal thermal conductor 24H, giving up its energy thereto and wicking back to the evaporator end 94 via a wick 98 as shown. Heat energy given up at the condenser end 96 is conducted horizontally by the thermal conductor 24H to the thermal conductor 24 (to the left) which is in contact with the heat sink interface means 60 as shown.

In forming the heat pipe HP, illustrated in FIG. 3, working fluid WF is introduced into the heat pipe HP after the substrate 20 is fired via a channel 100 which extends between the side S2 and the heat pipe HP as shown. Thereafter the channel 100 may be closed by means of the suitable ceramic plug 102 or the like. It should be understood that during the forming process, the chamber 90 is temporarily filled with an organic material which prevents collapse of the chamber 90 as pressure is applied during the lamination process. When fired organic material burns off and leaves the chamber 90 empty for the later introduction of the working fluid WF. Wick 98 may be formed of a suitable ceramic powder material deposited within the chamber 90 prior to firing or may be a wick line formed by a laser.

Figure 7A:
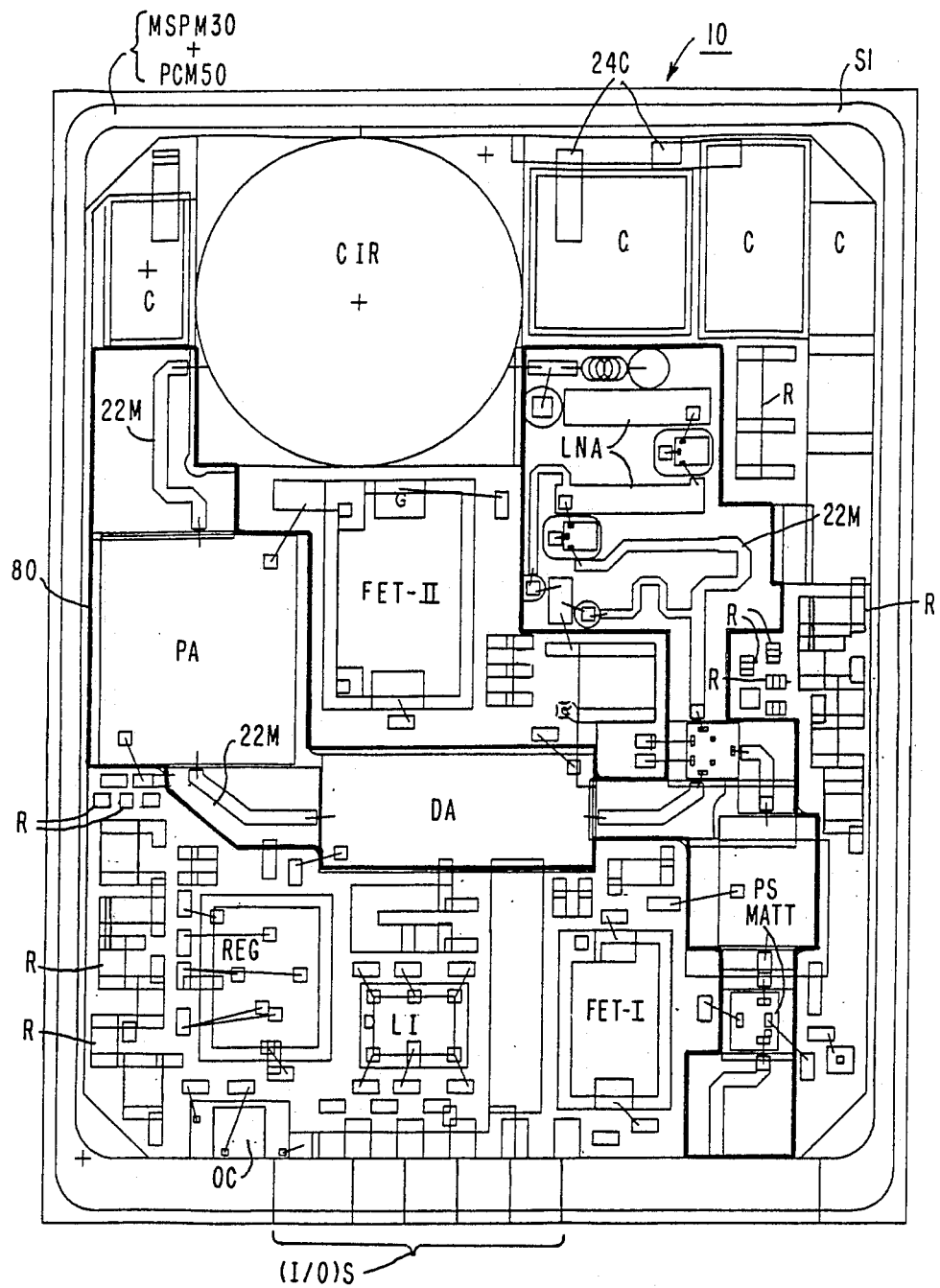
FIGS. 7A-7B are respective top and bottom views of a T/R module with the components of each functional subsystem disposed on the multi-layer substrate.
Figure 7B:
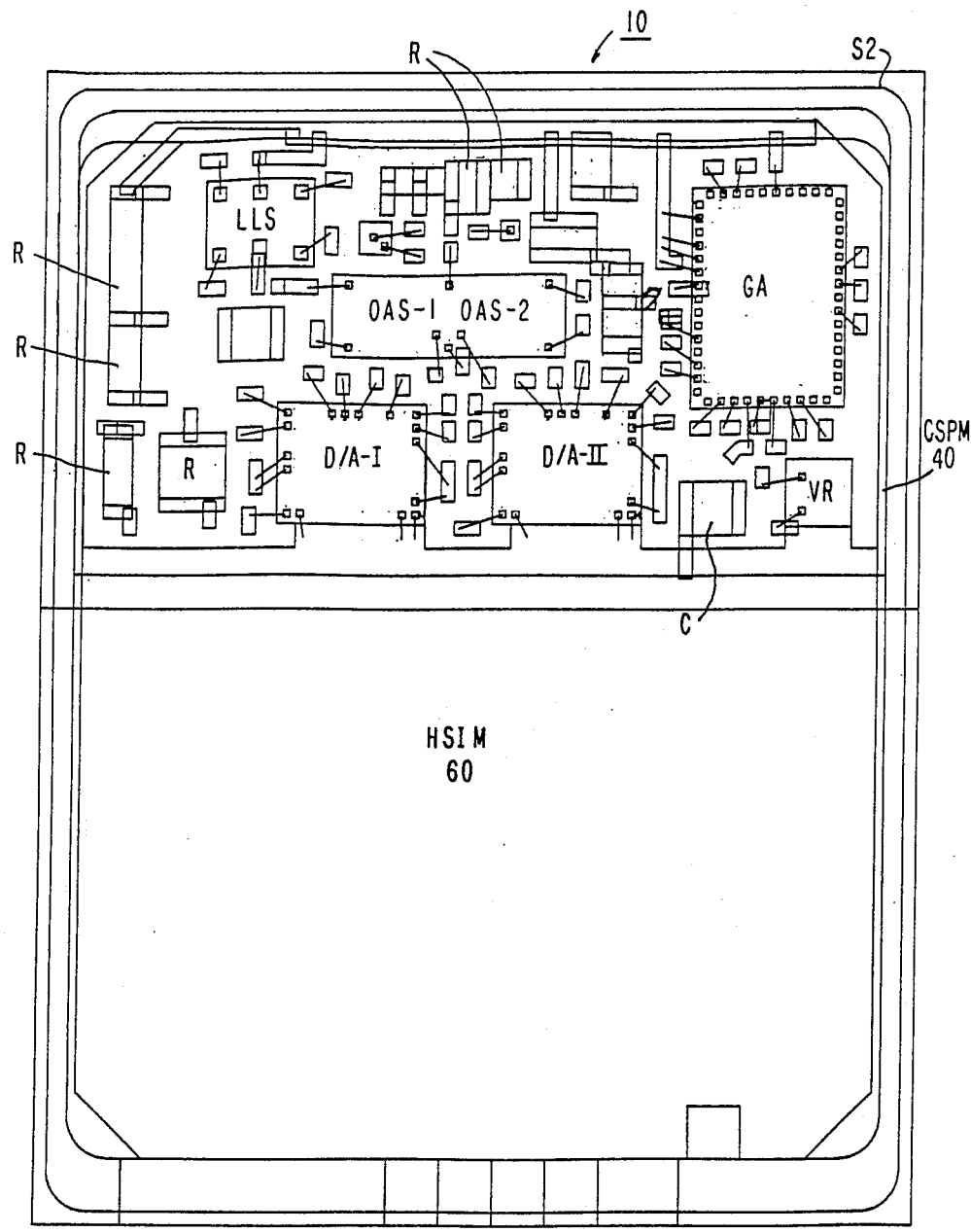

FIGS. 7A and 7B illustrate opposite sides S1 and S2 of an exemplary embodiment of the T/R module 10 of the present invention. In particular, the illustrations in FIGS. 7A and 7B represent the layout of the various circuit elements which are shown schematically in FIGS. 1 and 6. The side S1 shown in FIG. 7A supports the components forming the microwave signal processing means 30 (MSPM 30) and power conditioning means 50 (PCM 50) shown in FIGS. 1, 2 and 6. Side S2 shown in FIG. 7B supports the components forming the control signal processing means 40 (CSPM 40) and the heat sink interface means 60 (HSIM 60) in side-by-side relationship. Referring to FIG. 7A, elements generally labeled R are, for the most part, relatively low tolerance thick film resistors adapted for biasing various circuits in the T/R module 10. Resistor RT, however, is part of the power conditioning means PCM 50 and may be trimmed by a laser in a known manner in order to adjust or tune the resistor to a particular value. Elements generally labeled with the reference numeral C are energy storage capacitors which are mounted vertically (see FIG. 3). The capacitors C may be mounted to the substrate 20 at the lower end by a power pad 22PP as shown in FIG. 3. At the top end, capacitors C are connected to other elements by means of an electrical conductor 24C. A bridging connector 24B (FIG. 3) may be used to couple adjacent upper ends of the capacitors C.

Microwave striplines are identified by the reference numeral 22M at various locations in FIG. 7A. Other circuit elements are labeled, in general, in accordance with the designations in FIG. 6 except that the microwave signal processing means 30 and power conditioning means 50 have their elements placed on the substrate 20 in the configuration shown in FIG. 7A in order to optimize the available real estate and to place the heat generating elements close to the thermal conductors 24. The heavy border line 80 represents the shape of the chip carrier 80 which is supported by the surface S1. As mentioned earlier, the chip carrier 80 has good thermal conductivity and helps to carry heat generated by the particular elements towards the thermal conductors 24, which in turn are coupled to the heat sink interface means 60 on the opposite side S2 (FIG. 7B) of the T/R module 10. Input and input/output pads are generally labeled (I/O)s. Optical coupler OC may be provided for optically connecting a data stream to the module 10. The optical coupler OC may include a prisim and optical sensor (described hereinafter in FIG. 8).

Referring to FIG. 7B, showing side S2, heat sink interface means 60 is located in thermal proximity to the thermal conductors 24 so that adequate heat exchange can occur, and so that heat generated in the power conditioning means 50 and microwave signal processing means 30 from side S1 may be conducted to the heat sink interface means 60 efficiently. The elements illustrated in the control signal processing means 40 in FIG. 7B correspond to the elements illustrated in FIG. 6. Resistors and capacitors are respectively labeled R and C. A voltage reference integrated circuit VR provides reference voltage and logic supply for the various components of CSPM 40.

Figure 4:
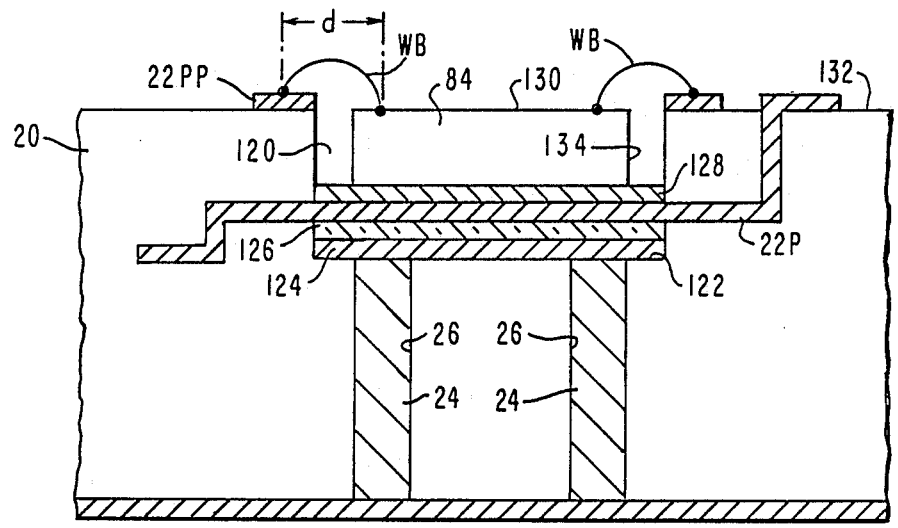
FIG. 4 is an illustration of an integrated component recessed into the multi-layer substrate of the present invention.

FIG. 4 shows another embodiment of the present invention in which a chip 84 is mounted in a recess 120 of the substrate 20. In the arrangement of FIG. 4, a bottom wall 122 of the recess 120 is formed with thermal vias 26 into which thermal conductor 24 has been deposited as hereinbefore described. Above the bottom wall 122 is a layer of thermally conductive material 124 and an optional layer of insulating glass or other dielectric 126. Above the dielectric 126 is a power conductor 22P. A layer of solder or electrically conductive epoxy 128 is used to attach the chip 84 to the power conductor 22P. An upper surface 130 of the chip is, more or less, coplanar with an upper surface 132 of the substrate 20. The advantage of the coplanar relationship between the upper surface 130 of the chip 84 and the upper surface 132 of the substrate 20 is that the wire bonds WB may be made shorter and less susceptible to RF interference than when the chip 84 is located above the substrate surface 132. In the arrangement in FIG. 4, the distance d between the point at which the wire bond WB is attached to the top 130 of the chip 84 and the point at which it is attached to the power pads 22PP on the surface 132 of the substrate 20 is less than a comparable distance d' shown in FIG. 3, for example. The reason for the decreased distance is that wire bonding tools (not shown but known by those skilled in the art) used to produce wire bonds need sufficient clearance in order to clear the side wall 134 of the chip 84 when the chip is located on the substrate surface 132. In addition, the recessed arrangement allows for better manual or automatic alignment or fixturing during attachment of the chips 84 to the substrate 20. It is also possible to use solder preforms, which may be deposited within the recess 120, having tailored thermal and electrical impedance.

In addition to the foregoing, the arrangement in FIG. 4 illustrates that it is possible to isolate the chip 84 from the substrate 20 by means of the optional insulating glass layer 126. If desired, chips 84 may be directly coupled without the insulating glass layer 126 to a common plane, such as, a ground plane, or to separate power planes or conductors, such as the power conductor 22P. Alternatively, chips 84 may be isolated from a ground or power plane and mounted independently of each other thereby providing greater versatility to the arrangement of the present invention.

In another embodiment of the present invention, illustrated in FIGS. 5A-5C, a composite coaxial input/output cable coupler 110 is provided. In the arrangement of FIGS. 5A-5C, a signal carrying optical fiber OF is surrounded by a microwave conductor RF and an insulator I1. The cable coupler 110 is coaxial with an outer grounding sheath G surrounded by an insulator I2 and a segmented coupler SC. An insulating cover IS surrounds the segmented coupler SC. In FIGS. 5A and 5B, respective end and side views of the cable coupler are shown which illustrate segmented coupler SC in detail. According to the invention, the segmented conductor SC may be divided into conductive portions CP and insulated portions IP. Thus, a variety of signals can be transmitted along each of the conductive portions CP independently for multiple function control. A power conductor PC may be located about the outer portion of the cable coupler 110, as shown, or in any other convenient location. Outer sheath OS surrounds the connector 110 as shown.

EXAMPLE

The following is a discussion of a development T/R module made in accordance with the present invention.

The technology development module (hereinafter TDM) exemplified in FIGS. 7A and 7B contains a representation of each function for use in evaluating performance. For instance, the attenuator MATT and phase shifter PS monolithic microwave integrated circuits (MMIC's) used in the TDM provide one-third of the full attenuation and phase shift required in a full performance module. One voltage regulator REG is inserted into the TDM, and through this regulator passes the switched, high peak current used by the microwave signal processing means 30. A plurality of MMIC chips set on the chip carrier 80 include power amplifier PA, drive amplifier DA, attenuator MATT, phase shifter PS, and two stage low noise amplifiers LNA using GaAs manufacturing thin film techniques.

I. MULTILAYER SUBSTRATE

The alumina-glass technology developed by E.I. Dupont and sold under the trademark GREEN TAPE is used to fabricate the multilayered ceramic substrate used in the present invention. Each layer L1-L8 (FIG. 3) is 4.5 mils thick in the green state, and the tape as a whole is flexible and punchable. Electrical vias 10 mils in diameter and thermal vias 25 mils in are punched in pieces blanked from a 10-inch wide roll of GREEN TAPE. All vias are backfilled with gold paste such as 5718D manufactured by DuPont. Conductor patterns are printed onto the green tape using off-contact screen printing procedures and material such as 5717 manufactured by DuPont. The tape with conductor patterns and filled vias is dried at 120° C. for five minutes. Sets of collated and registered circuit layers are placed between two sheets of mylar in a pressing die and are laminated at 70° C. and 3000 psi. Laminated stacks are trimmed to pre-firing size with a hot razor, steel rule die set or dicing saw. Burnout occurs at 350° C. for one hour in a convection oven, during which most of the organics are volatilized, oxidized and removed. (This prevents blistering during subsequent firing.) Firing is accomplished in a conventional thick film furnace for approximately two hours at a peak temperature of 850° C. for about 15 minutes. Shrinkage of approximately 12% occurs in the x and y dimensions and 17.5% in the thickness dimension. Top and bottom surface metalization is screened on using material such as 5715 manufactured by DuPont and post fired. Then, thick film resistors (e.g., DuPont 1700 or 1900 series and blends thereof), additional dielectric layers (e.g., DuPont 5704), and metal layers (e.g., DuPont 9791 and 9910) are applied as needed and fired.

II. THERMKON MICROWAVE CHIP CARRIER

Thermkon is the trade name for a tungsten copper metal matrix material produced by Contact Metals Welding, Inc. It was selected for use in the TDM because it has good thermal conductivity (approximately 1.7 watts/cm-degree K) and has a coefficient of thermal expansion that very closely matches that of GaAs ($6.2 \times 10^{-6}$ in/in per °C.). Since GaAs MMICs tend to be large, very thin, and extremely brittle, a difference in expansion coefficients nearly equal to $1 \times 10^{-6}$ in/in per °C. between the chip and the metal chip carrier is desirable.

The complex shaped carrier 80 (shown by the broad line 80 in FIG. 7A) for the TDM is a wire-EDMed (electron discharge machined) from a metal blank and plated. The 10 mil thick soft dielectric substrate material 84 is punched or machined from sheet stock that has half-ounce copper rolled onto the top side. The punched or machined soft substrate is bonded to the thermkon carrier; then, microstrip circuitry is exposed onto the copper using photolithography. The carrier is etched and plated, and is then ready for MMIC chip mounting. The chip carrier 80 is provided with its full complement of MMICs, and the miniature microwave circuit subassembly is tested.

Other materials useful for the chip carrier 80 include metal laminants or composites formed by hot isostatic pressing (HIP) techniques. For example, nickel-clad molybdenum and copper-clad molybdenum have been found to be useful. The thickness of the nickel, copper and molybdenum layers may be tailored to adjust the coefficient of expansion so that the composite matches as closely as possible that of the gallium arsenide substrate bonded thereto. The nickel-clad molybdenum and copper-clad molybdenum composites may be punched but preferably the laminants are machined using electrochemical machining ECM.

A matrix of molybdenum and copper such as CM15, manufactured by Toshiba, has desirable thermal properties which make the material useful for a chip carrier. CM15 may also be readily machined using carbide and steel tooling.

Figure 8:
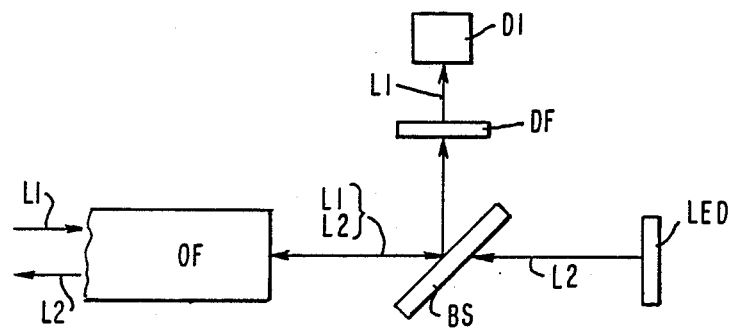
FIG. 8 is a schematic illustration of an exemplary multi-wavelength input/output optical channel.

FIG. 8 illustrates schematically a useful configuration of an optical fiber OF in which multiple wavelengths L1-L2 of energy may be propagated in two directions therealong. In the arrangement of FIG. 8 the optical fiber OF carries an input signal of the wavelength L1 which is reflected towards an optical coupler or detector D1 by means of a beam splitter BS. A dichroic filter DF is interposed between the detector D1 and the beam splitter BS to filter out all wavelengths except L1. A light emitting diode or LED generates an output signal at a wavelength L2 which is coupled to the optical fiber OF through the beam splitter BS so that the optical fiber may carry two signals simultaneously. At the other end of the optical fiber (not shown), a receiver and filter for L2, a transmitter for L1 and a beam splitter are arranged in a manner similar to the arrangement shown, which should be readily apparent to those skilled in the art. Other arrangements are possible, of course, using more complex optical multiplexing techniques if desired.

While the invention has been described in connection with specific embodiments thereof, it will be understood that it is capable of further modifications. The claims are intended to cover any variations, uses or adaptations of the invention following, in general, the principles of the invention, and including such departures from the present disclosure as come within known and customary practice within the art to which the invention pertains.

I claim as my invention:

1. A microwave transmit-receive module comprising:
   a single multi-layer substrate including a plurality of integrated dielectric layers, and electrical conductors and thermal conductors selectively interconnected integrally between the layers of the substrate;
   a microwave signal processing means including a plurality of integrated components and discrete thick film components mounted on the substrate and interconnected with the electrical and thermal conductors for processing microwave microwave signal;
   a control signal processing means including a plurality of integrated components and discrete thick film components mounted on the substrate and interconnected via the electrical conductors with the microwave signal processing means for providing control signals therefor;
   a power conditioning means including a plurality of integrated components and discrete thick film components mounted on the substrate and interconnected via the electrical conductors with the microwave signal conditioning means and the control signal conditioning means for providing power thereto; and
   a heat sink interface means including a discrete thick film mounted on the substrate and selectively interconnected at least via the thermal conductors with the microwave processing means and the power conditioning means for carrying heat energy away therefrom.

2. The module of claim 1, wherein the substrate has at least two opposed mounting surfaces.

3. The module of claim 2, wherein each of said microwave signal processing means, said control signal processing means and said power conditioning means occupy a selected area of said opposed surfaces and said heat sink interface means occupies a portion of at least one of said surfaces of the substrate in thermal proximity to at least the microwave signal processing means and the power conditioning means.

4. The module of claim 1, wherein electrical conductors comprise conductive films disposed substantially parallel with the layer of the substrate and electrical vias disposed in openings in the substrate substantially perpendicular with the layers.

5. The module of claim 1, wherein the thermal conductors comprise thermal vias disposed in openings within the substrate substantially perpendicular to the layers.

6. The module of claim 1, including buried thick film passive elements within the substrate.

7. The module of claim 1, including a heat pipe intergral with the substrate for conducting heat therein.

8. The module of claim 1, wherein the substrate has at least one aperture formed in at least one of the mounting surfaces for receiving therein an integrated component therein, said recess being sufficiently deep so that an outwardly facing surface of the integrated component is subtantially coplanar with the component mounting surface into which the aperture is formed.

9. The module of claim 1, further including chip carrier means for supporting selected components of the power conditioning means and the microwave signal processing means mounted on one surface of the substrate.

10. The module of claim 9, wherein the chip carrier includes at least a GaAs substrate, microwave striplines and integrated components bonded thereto.

11. The module of claim 10, wherein said chip carrier includes a thermally conductive layer supporting the GaAs substrate bonded to the multi-layer substrate in thermal relation with the thermal conductors and heat sink interface.

12. The module of claim 11, wherein the thermally conductive layer comprises a matrix of copper and tungsten.

13. The module of claim 11, wherein the thermally conductive layer comprises a molybdenum layer, and at least one of a copper layer and nickel layer bonded thereto.

14. The module of claim 13, wherein the molybdenum, nickel and copper layers are formed of selected thicknesses for selectively adjusting the thermal expansion of the conductive layer.

15. The module of claim 11, wherein the thermally conductive layer comprises a composite of molybdenum and copper.

16. The module of claim 1, further comprising an input/output means including an optical fiber for conveying optical signals thereto.

17. The module of claim 16, further comprising a coaxial RF I/O conductor surrounding the optical fiber.

18. The module of claim 16, wherein the optical fiber has means at least at one end of the optical fiber for selectively transmitting and receiving optical signals of different wavelengths.

19. The module of claim 18, wherein the means for transmitting and receiving optical signals of different wavelengths of optical energy includes a beam splitter for separating the optical energy into different beams, a dichroic filter for separating the beams into selected wavelengths, a detector means for detecting at least one of the selected wavelengths, and a light emitting diode for emitting at least a different one of the selected wavelengths.

20. The module of claim 16, wherein the input/output means further includes:
   a segmented control signal sheath, including separate insulated signal carrying conductors; and
   a coaxial grounded sheath, power sheath and insulating sheaths.

21. The module of claim 1, further including an optical input coupler for the control signal processing means for carrying control signals thereto.

22. A microwave transmit-receive module comprising:
   a single multi-layer substrate including a plurality of integrated dielectric layers, electrical conductors and thermal conductors selectively interconnected between layers of the substrate having at least two opposed component mounting surfaces;
   microwave signal processing means mounted on at least one of the component mounting surfaces of the substrate for processing microwave signals;
   control signal processing means mounted on at least one of the component mounting surfaces of the substrate for providing control signals for the microwave signal processing means via selected electrical conductors;
   power conditioning means mounted on at least one of the component mounting surfaces of the substrate for providing power to the microwave signal processing means and the control signal processing means via selected electrical conductors; and
   heat sink interface means coupled to the thermal conductors and mounted on at least one of the component mounting surfaces of the substrate in thermal proximity at least to the microwave signal processing means the power conditioning means and the control signal processing means for conducting thermal energy away therefrom via selected thermal conductors.

23. The module of claim 1 wherein the multi-layer substrate is formed of a hermetic, cofired ceramic material.

24. The module of claim 21 wherein the multi-layer substrate is formed of a hermetic, cofired ceramic material.

* * * * *